(12) United States Patent
Wang et al.

(10) Patent No.: US 12,211,767 B2
(45) Date of Patent: Jan. 28, 2025

(54) SEMICONDUCTOR STRUCTURE AND METHOD FOR MANUFACTURING SAME

(71) Applicant: CHANGXIN MEMORY TECHNOLOGIES, INC., Hefei (CN)

(72) Inventors: Luguang Wang, Hefei (CN); Xiaoling Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 451 days.

(21) Appl. No.: 17/643,399

(22) Filed: Dec. 8, 2021

(65) Prior Publication Data

US 2023/0005810 A1 Jan. 5, 2023

Related U.S. Application Data

(63) Continuation of application No. PCT/CN2021/120326, filed on Sep. 24, 2021.

(30) Foreign Application Priority Data

Jul. 5, 2021 (CN) .......................... 202110758280.2

(51) Int. Cl.
*H01L 23/367* (2006.01)
*H01L 21/308* (2006.01)
*H01L 21/768* (2006.01)
*H01L 23/373* (2006.01)

(52) U.S. Cl.
CPC ........ *H01L 23/367* (2013.01); *H01L 23/3736* (2013.01); *H01L 21/3083* (2013.01); *H01L 21/76898* (2013.01)

(58) Field of Classification Search
CPC ............... H01L 23/367; H01L 23/3736; H01L 23/3677; H01L 21/3083; H01L 21/76898
See application file for complete search history.

(56) References Cited

U.S. PATENT DOCUMENTS 9,805,977 B1 * 10/2017 Sukumaran ....... H01L 21/76898
2012/0037969 A1 * 2/2012 Sanders ................. H01L 28/10
257/296

FOREIGN PATENT DOCUMENTS

CN 111863754 A 10/2020

OTHER PUBLICATIONS

CN111863754, Wang (Year: 2020).*

* cited by examiner

*Primary Examiner* — Patricia D Valenzuela
(74) *Attorney, Agent, or Firm* — Syncoda LLC; Feng Ma

(57) ABSTRACT

A semiconductor structure includes: a substrate; a through silicon via structure that is located in the substrate; a first heat dissipation layer that is around a side wall of the through silicon via structure, and a material of which is a metal semiconductor compound; and a second heat dissipation layer that is around the side wall of the through silicon via structure and located between the first heat dissipation layer and the through silicon via structure, and a heat conductivity of which is greater than a heat conductivity of the first heat dissipation layer.

16 Claims, 11 Drawing Sheets

SEMICONDUCTOR STRUCTURE AND METHOD FOR MANUFACTURING SAME

CROSS-REFERENCE TO RELATED APPLICATIONS

This is a continuation of International Application No. PCT/CN2021/120326 filed on Sep. 24, 2021, which claims priority to Chinese Patent Application No. 202110758280.2 filed on Jul. 5, 2021. The disclosures of the above-referenced applications are hereby incorporated by reference in their entirety.

BACKGROUND 3D integration technology is a relatively advanced electronic packaging technology in the modern semiconductor industry, in which the manufacturing technology of high performance TSVs (through silicon vias) is a key factor that restricts the rapid development of the 3D integration technology.

SUMMARY

The present disclosure relates to a semiconductor structure and a method for manufacturing the same.

The embodiments of the present disclosure provide a semiconductor structure. The structure includes: a substrate; a through silicon via structure that is located in the substrate; a first heat dissipation layer that is disposed around a side wall of the through silicon via structure, and a material of which is a metal semiconductor compound; and a second heat dissipation layer that is disposed around the side wall of the through silicon via structure and located between the first heat dissipation layer and the through silicon via structure, and a heat conductivity of which is greater than a heat conductivity of the first heat dissipation layer.

The embodiments of the present disclosure further provide a method for manufacturing a semiconductor structure, the method includes: providing a substrate having a through via therein; forming a first heat dissipation layer at least located on a side wall of the through via; and forming a through silicon via structure and a second heat dissipation layer in the through via, in which the first heat dissipation layer surrounds a side wall of the through silicon via structure, and a material of the first heat dissipation layer is a metal semiconductor compound; the second heat dissipation layer surrounds the side wall of the through silicon via structure and is located between the first heat dissipation layer and the through silicon via structure, and a heat conductivity of the second heat dissipation layer is greater than a heat conductivity of the first heat dissipation layer.

BRIEF DESCRIPTION OF THE DRAWINGS

One or more embodiments are illustrated by the figures in the accompanying drawings which, unless specifically stated, do not constitute scale limitations.

DETAILED DESCRIPTION

A TSV structure is a high power-consumption integrated body composed of multilayer materials, which causes heat accumulation and the heat is difficult to be effectively dissipated, and the excessive heat flow density affects the electrical characteristics of a chip, resulting in reduced reliability and stability of the TSV structure.

On the premise of ensuring the working performance of a TSV structure, how to improve the heat dissipation rate of the TSV structure may need to be solved.

In order to solve the above problem, the present disclosure provides a semiconductor structure in which a first heat dissipation layer surrounds a through silicon via structure, and the material of the first heat dissipation layer is a metal semiconductor compound, so that heat can be transmitted out more efficiently, thereby reducing the temperature of the semiconductor structure; in addition, the second heat dissipation layer is located on the surface of the first heat dissipation layer, and the heat conductivity of the second heat dissipation layer is greater than that of the first heat dissipation layer, which can further increase the heat dissipation of the semiconductor structure, thus ensure the stable operation of the semiconductor structure and prolong its service life.

In order to make the objectives, technical solutions and advantages of the embodiments of the present disclosure clearer, the following describes the embodiments of the present disclosure in detail with reference to the accompanying drawings. However, a person of ordinary skill in the art may understand that in each embodiment of the present disclosure, many technical details are proposed for the reader to better understand the present disclosure. However, even without these technical details and various changes and modifications based on the following embodiments, the technical solutions claimed in the present disclosure—can be realized.

The semiconductor structure provided in the embodiments of the present disclosure will be described in detail below with reference to the accompanying drawings.

Figure 1:
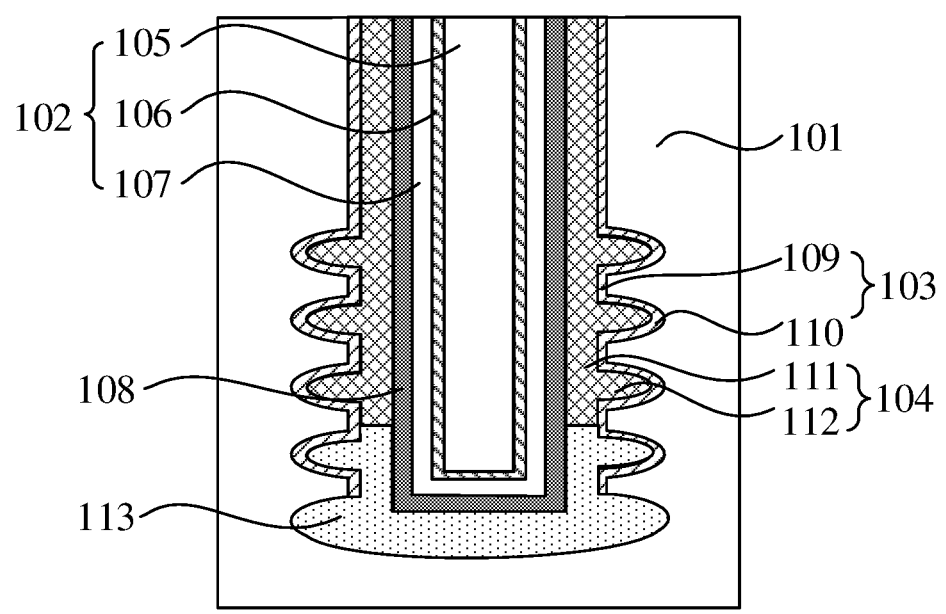
FIG. 1 is a schematic cross-sectional view of a semiconductor structure according to an embodiment of the present disclosure.

Referring to FIG. 1, the semiconductor structure includes: a substrate 101; a through silicon via structure 102 that is located in the substrate 101; a first heat dissipation layer 103 that is disposed around the side wall of the through silicon via structure 102, and the material of which is a metal semiconductor compound; and a second heat dissipation layer 104 that is disposed around the side wall of the through silicon via structure 102 and located between the first heat dissipation layer 103 and the through silicon via structure 102, and the heat conductivity of which is greater than the heat conductivity of the first heat dissipation layer 103.

The embodiments of the present disclosure provide the semiconductor structure having a new heat dissipation device, which can be applied to a memory circuit. The semiconductor structure includes the first heat dissipation layer 103 and the second heat dissipation layer 104, the first heat dissipation layer 103 is located in the substrate 101, the second heat dissipation layer 104 is located on the surface of the first heat dissipation layer 103, and both the first heat dissipation layer 103 and the second heat dissipation layer 104 surround the through silicon via structure 102, which enables the internal heat of the through silicon via structure 102 to be transferred to a position away from the through silicon via structure 102 via the first heat dissipation layer 103 and the second heat dissipation layer 104, thereby reducing the internal heat of the through silicon via structure 102.

The semiconductor structure provided in the embodiments of the present disclosure will be described in more detail below with reference to the accompanying drawings.

The semiconductor structure may be a wafer, a chip, or a package structure. In some embodiments, the through silicon via structure 102 is configured to be the heat dissipation channel of the semiconductor structure, and accordingly, the arrangement of the first heat dissipation layer 103 and the second heat dissipation layer 104 is conducive to further improving the heat dissipation capability of the heat dissipation channel. In another embodiment, the through silicon via structure 102 may also serve as a conductive channel of the semiconductor structure, and the arrangement of the first heat dissipation layer 103 and the second heat dissipation layer 104 is conducive to the heat dissipation of the conductive channel, so as to avoid an overheating phenomenon caused by charge accumulation, thereby improving the heat dissipation rate of the semiconductor structure.

In some embodiments, substrate 101 is a semiconductor substrate. Accordingly, the substrate 101 may be a semiconductor substrate such as a silicon substrate, a germanium substrate, a silicon germanium substrate, or a silicon carbide substrate. The substrate 101 may include active areas (AA) and isolation structures (STI, shallow trench isolation) for isolating adjacent active areas.

In this embodiment, the through silicon via structure 102 is a laminated structure, specifically, the through silicon via structure 102 includes a conductor layer 105 located in the substrate 101; a seed layer 106 located on the side wall and the bottom of the conductor layer 105; a barrier layer 107 located on the surface of the seed layer 106 away from the conductor layer 105.

Specifically, the material of the conductor layer 105 may be Cu, Al or W. Generally, the conductor layer 105 may be formed by using an electroplating process. Herein the seed layer 106 serves as an electroplating seed layer of the electroplating process, and the material of the seed layer 106 may be the same as the material of the conductor layer 105. The barrier layer 107 blocks the metal ions in the conductor layer 105 from diffusing into the substrate 101, and may also be configured to improve adhesion between the substrate 101 and the seed layer 106. In some embodiments, the material of the barrier layer 107 may be Ta or TaN.

It can be understood that, in other embodiments, the through silicon via structure may also be a single-layer structure, specifically a conductor layer, and the material of the conductor layer may be Cu, Al, W or the like.

In this embodiment, the semiconductor structure may further include an isolation layer 108 located on the side wall and the bottom of the through silicon via structure 102 facing the substrate 101 and surrounding the through silicon via structure 102 in a U-shape. The active area and the field effect area are isolated by the isolation layer 108 to realize the electrical isolation between the through silicon via structure 102 and the substrate 101, which is conducive to reducing the parasitic capacitance and leakage current generated between the through silicon via structure 102 and the substrate 101, avoiding signal distortion and leakage current phenomenon, which increases the static power, affects the normal operation of the semiconductor structure. The isolation layer 108 provides a process foundation for forming the through silicon via structure 102.

The first heat dissipation layer 103 and the substrate 101 may be an integrated structure, so that problems such as delamination due to stress occurring at the interface between the first heat dissipation layer 103 and the substrate 101 may be avoided. Specifically, in the process of forming the first heat dissipation layer 103, the substrate 101 also serves as a process foundation for forming the first heat dissipation layer 103, that is, the material of the substrate 101 is also the material required for forming the first heat dissipation layer 103. More specifically, the metal element in the metal semiconductor compound may be Ni, Al, W or Ti, and correspondingly, the metal semiconductor compound may be at least one of nickel silicide, aluminum silicide, tungsten silicide or titanium silicide, that is, the material of the first heat dissipation layer 103 may be at least one of tungsten silicide, titanium silicide, aluminum silicide, and nickel silicide.

It should be noted that in other embodiments, the semiconductor element in the metal semiconductor compound is related to the material of the substrate. For example, if the substrate is a germanium substrate, the material of the metal semiconductor compound may be at least one of tungsten germanium, titanium germanium, aluminum germanium or nickel germanium.

The first heat dissipation layer 103 is disposed around the through silicon via structure 102. In this embodiment, the orthographic projection of the first heat dissipation layer 103 on the surface of the substrate 101 is a closed loop. It is understood that, in other embodiments, the orthographic projection of the first heat dissipation layer on the surface of the substrate may also be an unenclosed shape.

In some embodiments, referring to FIG. 1, the first heat dissipation layer 103 includes convex portions 109 and concave portions 110 distributed at intervals, and the convex portions 109 are connected with the concave portions 110. The convex portions 109 are convex toward the through silicon via structure 102, and the concave portions 110 are concave away from the through silicon via structure 102.

In some embodiments, the thickness of the convex portions 109 of the first heat dissipation layer 103 is greater than the thickness of the concave portions 110. It should be noted that in other embodiments, the thickness of the convex portions 109 in the first heat dissipation layer 103 may be equal to the thickness of the concave portions 110.

In some embodiments, referring to FIG. 1, the first heat dissipation layer 103 is located on the side wall of the substrate 101 facing the through silicon via structure 102.

Figure 2:
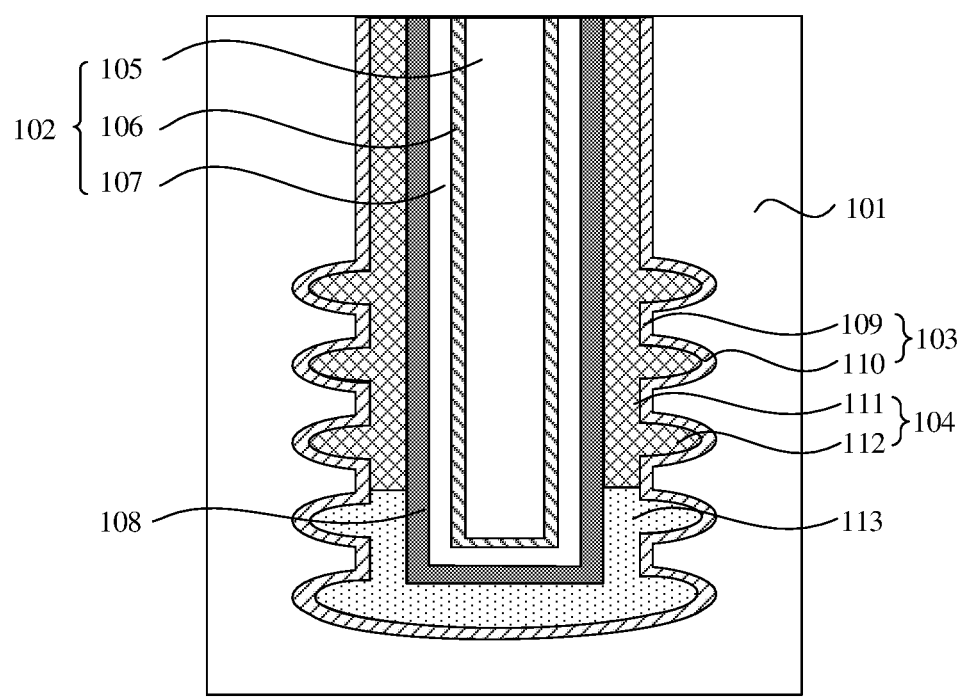
FIG. 2 is another schematic cross-sectional view of a semiconductor structure according to an embodiment of the present disclosure.

Referring to FIG. 2, in other embodiments, the first heat dissipation layer 103 may be located at the bottom of the through silicon via structure 102 in addition to the side wall of the through silicon via structure 102, so that the heat dissipation rate of the semiconductor structure may be further improved.

In this embodiment, the material of the second heat dissipation layer 104 is a metal including at least one of Ag, Au, Pt, Al, W, Ni or Ru.

Specifically, the second heat dissipation layer 104 is in contact with the first heat dissipation layer 103, and the second heat dissipation layer 104 is also in contact with the isolation layer 108. It is understood that in other embodiments, no isolation layer is provided within the semiconductor structure, and correspondingly, the second heat dissipation layer is in contact with the through silicon via structure.

The second heat dissipation layer 104 is also disposed around the through silicon via structure 102. In this embodiment, the orthographic projection of the second heat dissipation layer 104 on the surface of the substrate 101 is a closed loop. It is understood that, in other embodiments, the orthographic projection of the second heat dissipation layer on the surface of the substrate may also be an unenclosed shape.

The second heat dissipation layer 104 includes a plurality of connecting portions 111 and protruding structures 112 connecting adjacent connecting portions 111. Herein the connecting portions 111 are in contact with the convex portions 109 of the first heat dissipation layer 103, the protruding structures 112 are engaged in contact with the concave portions 110 of the first heat dissipation layer 103, and each of the protruding structures 112 is embedded in the corresponding concave portion 110.

Referring to FIG. 1 and FIG. 2, in some embodiments, the second heat dissipation layer 104 is located on a portion of the side wall, facing the through silicon via structure 102, of the first heat dissipation layer 103.

Figure 3:
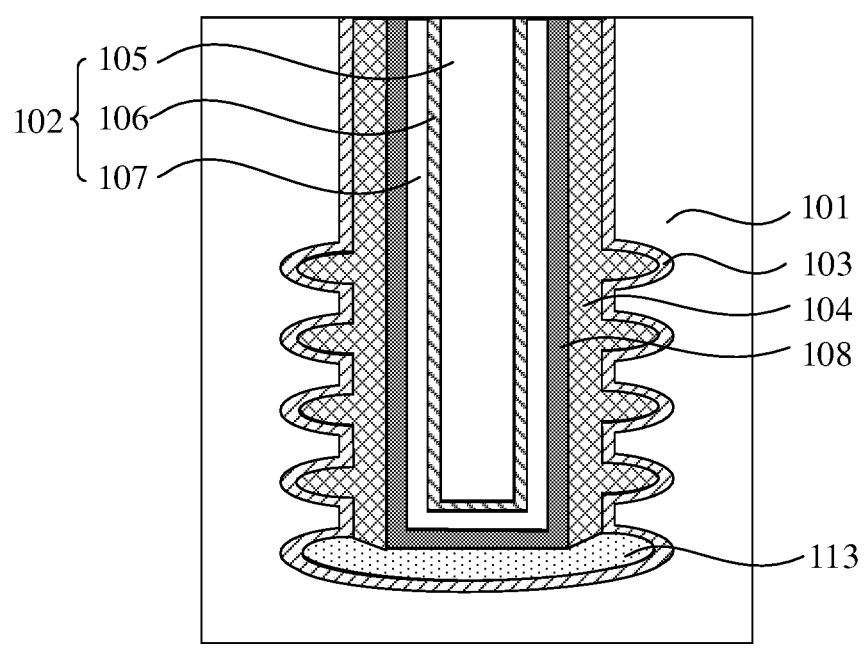
FIG. 3 is still another schematic cross-sectional view of a semiconductor structure according to an embodiment of the present disclosure.

Referring to FIG. 3, in other embodiments, the second heat dissipation layer 104 may also be located on entire side wall, facing the through silicon via structure 102, of the first heat dissipation layer 103 and at the bottom of the through silicon via structure. This solution can further increase the heat dissipation area of the second heat dissipation layer 104 compared to the solution in which the second heat dissipation layer 104 is located on a portion of the side wall of the first heat dissipation layer 103, thereby improving the heat dissipation rate of the semiconductor structure.

Figure 4:
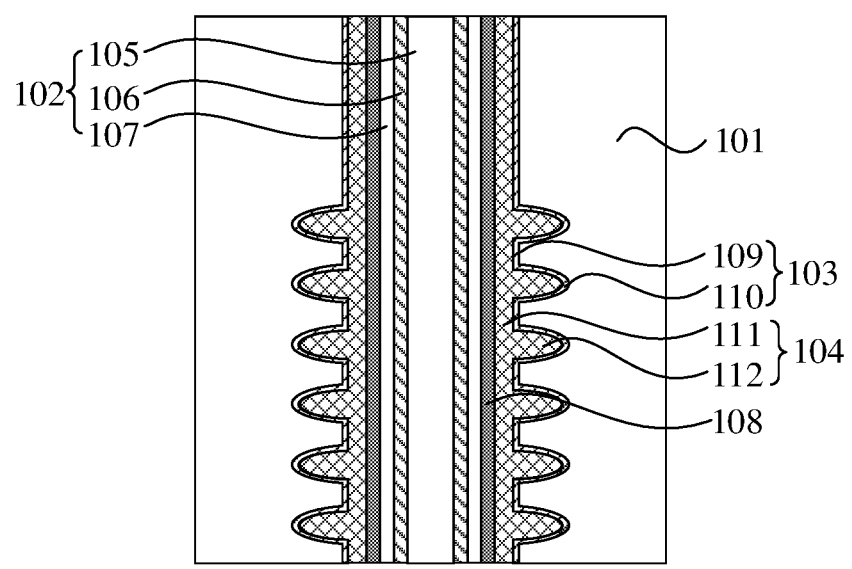
FIG. 4 is yet another schematic cross-sectional view of a semiconductor structure according to an embodiment of the present disclosure.

Referring to FIG. 4, in still other embodiments, the through silicon via structure 102 may penetrate the substrate 101, and accordingly, the bottom of the through silicon via structure 102, the bottom of the first heat dissipation layer 103, the bottom of the second heat dissipation layer 104, and the bottom of the substrate 101 are flush. In addition, the first heat dissipation layer 103 and the second heat dissipation layer 104 surround the entire side wall of the through silicon via structure 102.

In this embodiment, the semiconductor structure may further include a sacrificial layer 113, herein the sacrificial layer 113 is located at least at the bottom of the through silicon via structure 102, the sacrificial layer 113 is located between the first heat dissipation layer 103 and the through silicon via structure 102, and the sacrificial layer 113 is in contact with the second heat dissipation layer 104. The sacrificial layer 113 may function to support the through silicon via structure 102, thereby preventing the through silicon via structure 102 from tilting.

In some embodiments, the material of the sacrificial layer 113 is silicon nitride.

It can be understood that, in some embodiments, the sacrificial layer 113 may be located at the entire bottom area of the through silicon via structure 102. In other embodiments, the sacrificial layer 113 may be located at a portion of the bottom area of the through silicon via structure 102, and correspondingly, the second heat dissipation layer 104 may also be located at the bottom area of the through silicon via structure 102 in contact with the sacrificial layer 113.

Specifically, in this embodiment, the sacrificial layer 113 may also surround a portion of the side wall of the through silicon via structure 102, and the second heat dissipation layer 104 is located on top of and in contact with the sacrificial layer 113.

It should be noted that, in other embodiments, the semiconductor structure may not be provided with the sacrificial layer, correspondingly, the second heat dissipation layer is also located at the bottom of the through silicon via structure, and the second heat dissipation layer located at the bottom of the through silicon via structure is in contact with the first heat dissipation layer.

In the semiconductor structure provided in the embodiments of the present disclosure, due to the special arrangement of the first heat dissipation layer 103 and the second heat dissipation layer 104, the heat generated in the through silicon via structure 102 may be dissipated in a timely and effective manner, so as to avoid the increase of the operating temperature of the semiconductor structure, improve the heat dissipation effect, avoid the problem of excessive heat, thereby improving the reliability and stability of the semiconductor structure.

In addition, the structure of the plurality of connected convex portions 109 and concave portions 110 of the first heat dissipation layer 103 can effectively reduce expansion or shrinkage of the semiconductor structure due to heat stress, thereby avoiding stress deformation of the substrate 101, the second heat dissipation layer 104, and the sacrificial layer 113 in contact with them, and preventing damage to the semiconductor structure.

Correspondingly, the embodiments of the present disclosure further provide a method for manufacturing a semiconductor structure, which may be used to manufacture the above semiconductor structure. The following will describe in detail the manufacturing method provided in the embodiments of the present disclosure with reference to the accompanying drawings. It should be noted that the same or corresponding portions as those of the above embodiments can be referred to the detailed description of the above embodiments, and will not be described in detail below.

FIGS. 5 to 11 illustrate schematic diagrams corresponding to each step in a method for manufacturing the semiconductor structure according to an embodiment of the present disclosure.

Figure 5:
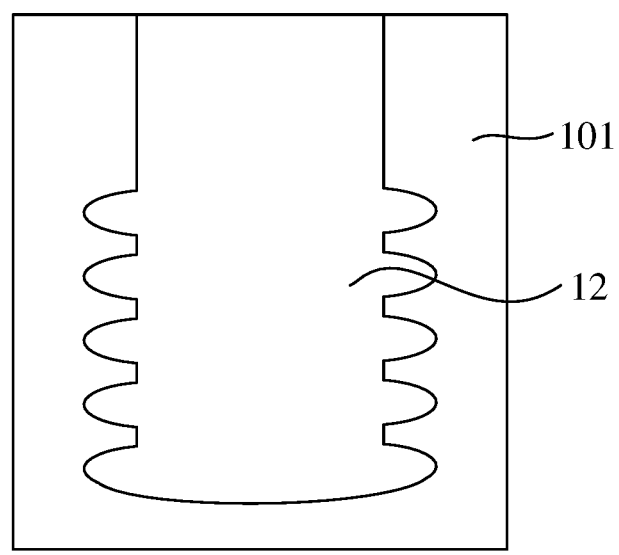
FIG. 5 is a first schematic diagram corresponding to a step in a method for manufacturing a semiconductor structure according to an embodiment of the present disclosure.

Referring to FIG. 5, a substrate 101 is provided, and there is a through via 12 in the substrate 101.

Specifically, the substrate 101 may be etched using a Bosh process to form the through via 12, and the side wall of the through via 12 has a "scallop" shape, that is, the side wall surface of the through via 12 has a certain roughness. In this embodiment, the through via 12 is a blind hole. In other embodiments, the through via may also be a through hole.

Figure 6:
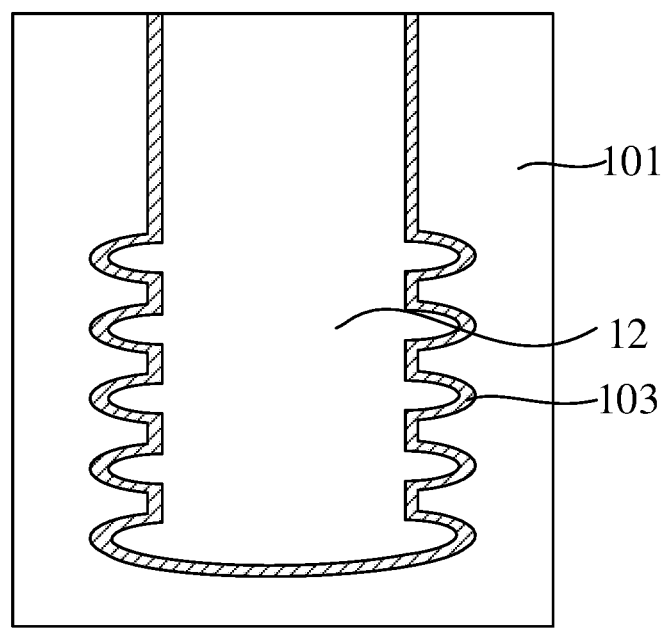
FIG. 6 is a second schematic diagram corresponding to a step in a method for manufacturing a semiconductor structure according to an embodiment of the present disclosure.

Referring to FIG. 6, a first heat dissipation layer 103 is formed. The first heat dissipation layer 103 is located at least on the side wall of the through via 12.

In addition, the process steps of forming the first heat dissipation layer 103 include forming a metal layer on the side wall of the through via 12, and then performing an annealing treatment (thermal processing), thus the metal layer reacts with the material of the substrate 101 to convert the metal layer into the first heat dissipation layer 103.

It should be noted that the thickness of the convex portions 109 (referring to FIG. 1) is larger than the thickness of the concave portions 110 (referring to FIG. 1). This is because of the following reasons. The inner surface of the through via is uneven, and the convex surface facing the through silicon via structure 102 is flat, which makes metal ions easier to be deposited. The concave surface away from the side of the through silicon via structure 102 has a larger curvature, which makes the metal ions are not easy to be deposited, and a larger heat stress causes metal ions on the concave surface to fall in the annealing process, resulting in a less thickness of the concave portion.

The thickness of the first heat dissipation layer 103 should not be too thin or too thick. If the thickness of the first heat dissipation layer 103 is too thin, the metal semiconductor compound generated by the annealing treatment is less, and the heat dissipation effect is limited. If the thickness of the first heat dissipation layer 103 is too thick, on the one hand, the base material of the substrate 101 cannot fully react with it to form the metal semiconductor compound, and on the other hand, it is not conducive to meeting the development trend of miniaturization of semiconductor structures.

Subsequent processes include forming a through silicon via structure and a second heat dissipation layer in the through via, in which the first heat dissipation layer surrounds the side wall of the through silicon via structure, the material of the first heat dissipation layer is the metal semiconductor compound, the second heat dissipation layer surrounds the side wall of the through silicon via structure and is located between the first heat dissipation layer and the through silicon via structure, and the heat conductivity of the second heat dissipation layer is greater than that of the first heat dissipation layer.

In this embodiment, forming the second heat dissipation layer after forming the through silicon via structure is taken as an example, and will be described in more detail below with reference to the accompanying drawings.

Figure 7:
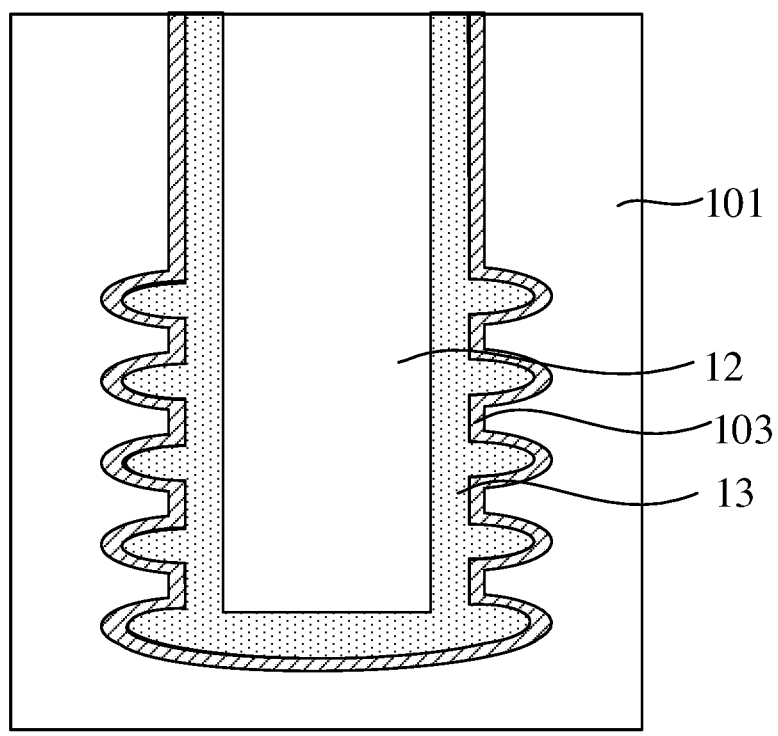
FIG. 7 is a third schematic diagram corresponding to a step in a method for manufacturing a semiconductor structure according to an embodiment of the present disclosure.

Referring to FIG. 7, an initial sacrificial layer 13 is formed on the surface of the first heat dissipation layer 103, and the initial sacrificial layer 13 is also located at the bottom of the through via 12.

The initial sacrificial layer 13 provides a process foundation for the subsequent formation of the sacrificial layer, and before forming the through silicon via structure, occupies the spatial position of the subsequent second heat dissipation layer to be formed.

In this embodiment, the material of the initial sacrificial layer 13 may be silicon nitride. In other embodiments, the material of the initial sacrificial layer may be other suitable insulating material.

Figure 8:
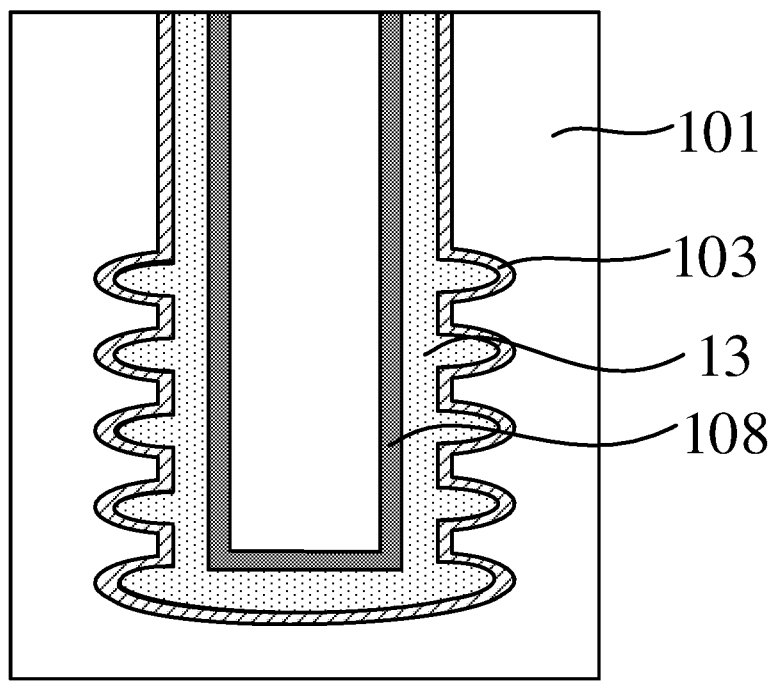
FIG. 8 is a fourth schematic diagram corresponding to a step in a method for manufacturing a semiconductor structure according to an embodiment of the present disclosure.

Referring to FIG. 8, an isolation layer 108 is formed on the surface of the initial sacrificial layer 13.

The electrical isolation between the subsequently formed through silicon via structure and the substrate 101 can be realized by the isolation layer 108, which helps to reduce parasitic capacitance and leakage current generated between the through silicon via structure and the substrate 101, and avoid signal distortion and leakage current phenomenon.

The isolation layer 108 provides a process foundation for forming the through silicon via structure.

In this embodiment, the material of the isolation layer 108 is silicon oxide.

Figure 9:
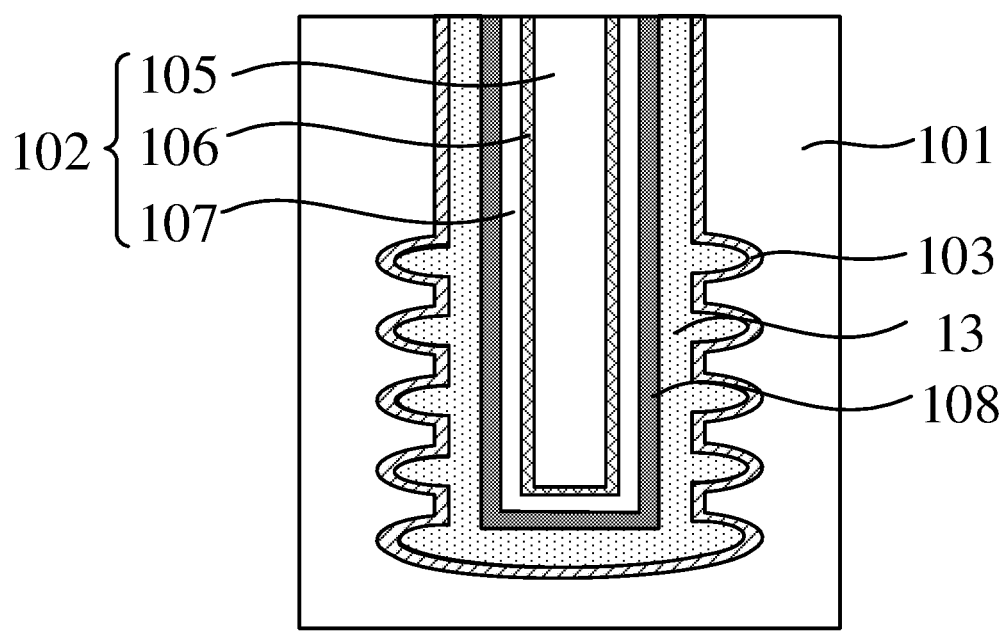
FIG. 9 is a fifth schematic diagram corresponding to a step in a method for manufacturing a semiconductor structure according to an embodiment of the present disclosure.

Referring to FIG. 9, the through silicon via structure 102 is formed on the initial sacrificial layer 13, and the through silicon via structure 102 fills up the through via 12.

In this embodiment, since the isolation layer 108 is formed on the surface of the initial sacrificial layer 13, the through silicon via structure 102 is formed on the surface of the isolation layer 108 accordingly.

Specifically, the step of forming the through silicon via structure 102 may include: forming a barrier layer 107 located on the surface of the isolation layer 108 by a deposition process; forming a seed layer 106 located on the surface of the barrier layer 107 by a deposition process; forming a conductor layer 105 that fills up the region surrounded by the seed layer 106 with an electroplating process.

Specifically, in this embodiment, the material of the conductor layer 105 is Cu, the material of the seed layer 106 is Cu, and the material of the barrier layer 107 is Ta.

Figure 10:
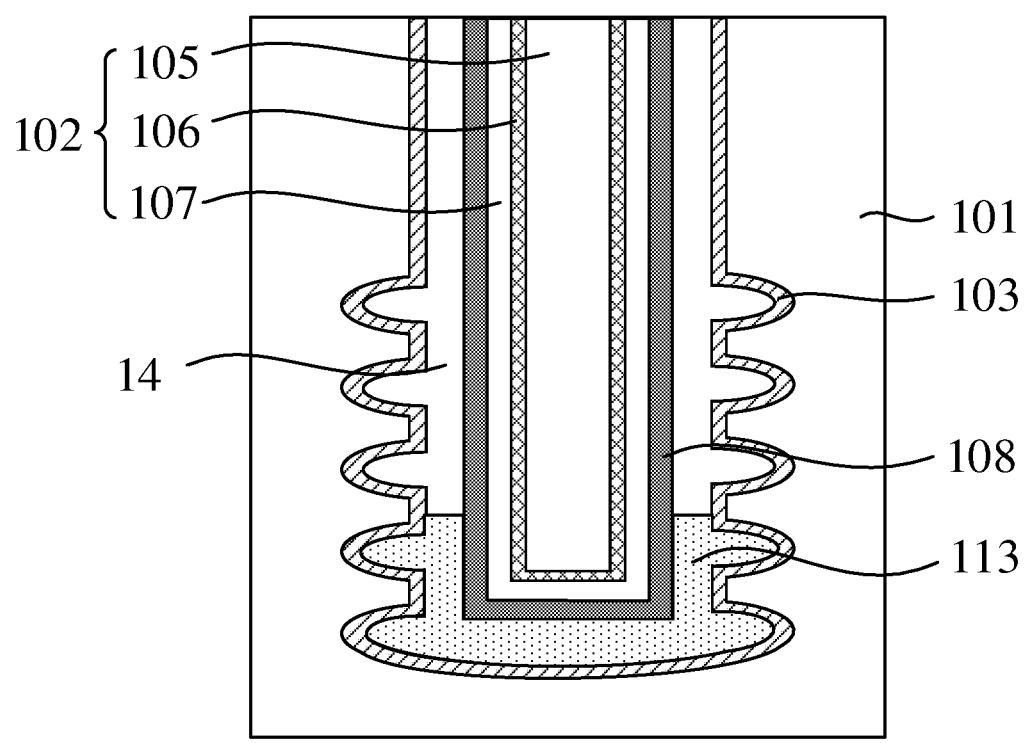
FIG. 10 is a sixth schematic diagram corresponding to a step in a method for manufacturing a semiconductor structure according to an embodiment of the present disclosure.

Referring to FIG. 10, a portion of the initial sacrificial layer 13 is removed by a wet chemical etching technology (refer to FIG. 9) to form an annular through via 14 surrounding the side wall of the through silicon via structure 102, and the remaining initial sacrificial layer 13 is served as a sacrificial layer 113.

The sacrificial layer 113 functions to support the through silicon via structure 102, thereby ensuring that the through silicon via structure 102 will not tilt.

In some embodiments, the entire initial sacrificial layer 13 surrounding the side walls of the through silicon via structure 102 may be removed, leaving only the initial sacrificial layer 13 at the bottom as the sacrificial layer 113, which provides a process foundation for subsequent formation of a larger area of the second heat dissipation layer 104.

Figure 11:
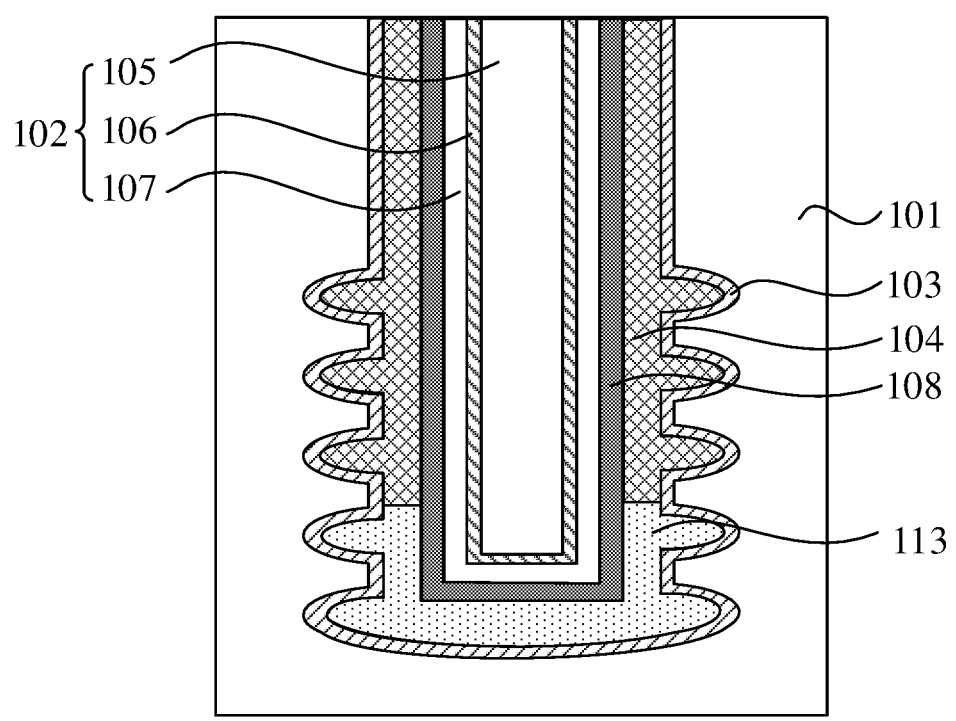
FIG. 11 is a seventh schematic diagram corresponding to a step in a method for manufacturing a semiconductor structure according to an embodiment of the present disclosure.

Referring to FIG. 11, the second heat dissipation layer 104 is formed. Herein the second heat dissipation layer 104 fills the annular through via 14 (referring to FIG. 10).

The process steps of forming the second heat dissipation layer 104 include: filling the annular through via 14 with metal particles using a spin coating process to form the second heat dissipation layer 104, and the second heat dissipation layer 104 fills the region defined by the first heat dissipation layer 103, the isolation layer 108, and a exposed surface, toward the upper surface of the substrate 101, of the sacrificial layer 113.

The thickness of the second heat dissipation layer 104 may be controlled by controlling the spin coating time, rotation speed, and dripping amount in the spin coating process, which can ensure that the second heat dissipation layer 104 has a good uniformity, which is conducive to the heat dissipation uniformity of the semiconductor structure.

In some embodiments, the heat conductivity of the second heat dissipation layer 104 is greater than the heat conductivity of the first heat dissipation layer 103.

In this embodiment, the material of the second heat dissipation layer 104 is single metal Ag, and in other embodiments, the material of the second heat dissipation layer may be a metal alloy.

It should be noted that the particle size of the material of the second heat dissipation layer 104 is larger than the particle size of the material of the first heat dissipation layer 103. On the one hand, the larger particle size can ensure that the material of the second heat dissipation layer 104 has a high flow ability and filling property, which facilitates the spin coating process, and on the other hand, the material particles of the second heat dissipation layer 104 have a larger interparticle distance, which can effectively buffer the influence of the heat expansion stress generated by the through silicon via structure 102.

In some embodiments, the second heat dissipation layer 104 is located on a portion or entire of the side wall of the first heat dissipation layer 103. In other embodiments, the second heat dissipation layer 104 may be located on the side wall and bottom of the first heat dissipation layer 103, so that the heat dissipation area of the second heat dissipation layer 104 may be increased, and the heat dissipation rate of the semiconductor structure may be further increased.

It should be noted that, in other embodiments, the sacrificial layer may not be formed. Correspondingly, the processes of forming the second heat dissipation layer and the through silicon via structure include: forming the second heat dissipation layer located on the surface of the first heat dissipation layer and at the bottom of the through via; and forming the through silicon via structure located on the surface of the second heat dissipation layer and filling up the through via.

Compared with the technical solution in which the sacrificial layer is provided first and then the sacrificial layer are removed and the metal particles are spin-on coated, the metal layer in this solution can also play the role of heat dissipation, and the sacrificial layer is not required to be provided, thereby the process procedure is shorter, and the semiconductor manufacturing cost may be reduced.

In addition, in other embodiments, when the through via is a through hole, the specific processes of forming the first heat dissipation layer, the through silicon via structure, and the second heat dissipation layer are the same as those in the above embodiments, and details are not described herein. Those of ordinary skill in the art will understand that the above implementations are specific embodiments for realizing the present disclosure, and in practical application, various changes may be made in form and details without departing from the spirit and scope of the present disclosure. Any person skilled in the art may make his own changes and modifications without departing from the spirit and scope of the present disclosure. Therefore, the protection scope of the present disclosure shall be subject to the scope limited by the claims.

What is claimed is:

1. A semiconductor structure, comprising:
   a substrate;
   a through silicon via structure located in the substrate;
   a first heat dissipation layer located inside the substrate, disposed around a side wall of the through silicon via structure, and a material of which is a metal semiconductor compound;
   a second heat dissipation layer located inside the substrate, disposed around the side wall of the through silicon via structure, and located between the first heat dissipation layer and the through silicon via structure, wherein a heat conductivity of which is greater than a heat conductivity of the first heat dissipation layer.

2. The semiconductor structure according to claim 1, wherein
   the heat conductivity of the first heat dissipation layer is greater than a heat conductivity of the substrate.

3. The semiconductor structure according to claim 1, wherein
   the first heat dissipation layer comprises convex portions and concave portions distributed at intervals, and the convex portions are connected to the concave portions, the convex portions are convex toward the through silicon via structure, and the concave portions are concave toward a direction away from the through silicon via structure; and
   the second heat dissipation layer comprises a plurality of connecting portions and protruding structures connecting adjacent connecting portions, and each of the protruding structures is embedded in a corresponding concave portion.

4. The semiconductor structure according to claim 3, wherein
   a thickness of the convex portions is greater than a thickness of the concave portions.

5. The semiconductor structure according to claim 1, wherein
   a material of the second heat dissipation layer is metal.

6. The semiconductor structure according to claim 1, wherein
   a particle size of the material of the second heat dissipation layer is larger than a particle size of a material of the first heat dissipation layer.

7. The semiconductor structure according to claim 1, wherein
   the second heat dissipation layer is further located at a bottom of the through silicon via structure, and the second heat dissipation layer located at the bottom of the through silicon via structure is in contact with the first heat dissipation layer.

8. The semiconductor structure according to claim 1, wherein
   the first heat dissipation layer is further located in the substrate facing a bottom of the through silicon via structure.

9. A semiconductor structure, comprising:
   a substrate;
   a through silicon via structure located in the substrate;
   a first heat dissipation layer, disposed around a side wall of the through silicon via structure, and a material of which is a metal semiconductor compound;
   a second heat dissipation layer, disposed around the side wall of the through silicon via structure, and located between the first heat dissipation layer and the through silicon via structure, wherein a heat conductivity of which is greater than a heat conductivity of the first heat dissipation layer;
   a sacrificial layer, located at least at a bottom of the through silicon via structure, and located between the first heat dissipation layer and the through silicon via structure.

10. The semiconductor structure according to claim 9, wherein
    the sacrificial layer further surrounds a portion of the side wall of the through silicon via structure, and the second heat dissipation layer is located on a top of the sacrificial layer and is in contact with the sacrificial layer.

11. The semiconductor structure according to claim 9, wherein
    the heat conductivity of the first heat dissipation layer is greater than a heat conductivity of the substrate.

12. The semiconductor structure according to claim 9, wherein
    the first heat dissipation layer comprises convex portions and concave portions distributed at intervals, and the convex portions are connected to the concave portions, the convex portions are convex toward the through silicon via structure, and the concave portions are concave toward a direction away from the through silicon via structure; and the second heat dissipation layer comprises a plurality of connecting portions and protruding structures connecting adjacent connecting portions, and each of the protruding structures is embedded in a corresponding concave portion.

13. The semiconductor structure according to claim 12, wherein a thickness of the convex portions is greater than a thickness of the concave portions.

14. The semiconductor structure according to claim 9, wherein a material of the second heat dissipation layer is metal.

15. The semiconductor structure according to claim 9, wherein a particle size of the material of the second heat dissipation layer is larger than a particle size of a material of the first heat dissipation layer.

16. The semiconductor structure according to claim 9, wherein the second heat dissipation layer is further located at a bottom of the through silicon via structure, and the second heat dissipation layer located at the bottom of the through silicon via structure is in contact with the first heat dissipation layer.

* * * * *